United States Patent
Fenstermaker (10) Patent No.: US 7,263,024 B2
(45) Date of Patent: Aug. 28, 2007

(54) CLOCK RESET ADDRESS DECODER FOR BLOCK MEMORY

(75) Inventor: Larry R. Fenstermaker, Nazareth, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/252,094

(22) Filed: Oct. 17, 2005

(65) Prior Publication Data

US 2007/0086263 A1   Apr. 19, 2007

(51) Int. Cl.
*G11C 8/00* (2006.01)

(52) U.S. Cl. .................. 365/230.06; 365/230.08; 365/233

(58) Field of Classification Search ............ 365/230.06
See application file for complete search history.

(56) References Cited

U.S. PATENT DOCUMENTS

| | | | | |
|---|---|---|---|---|
| 5,086,414 A | * | 2/1992 | Nambu et al. ......... | 365/230.08 |
| 5,295,115 A | * | 3/1994 | Furuya et al. ......... | 365/230.06 |
| 5,648,931 A | * | 7/1997 | Obara ................... | 365/189.05 |
| 5,668,772 A | * | 9/1997 | Hotta .................... | 365/230.06 |
| 6,181,635 B1 | * | 1/2001 | Bae ....................... | 365/230.06 |
| 6,501,702 B2 | * | 12/2002 | Takagiwa et al. ...... | 365/230.06 |
| 2001/0048632 A1 | * | 12/2001 | Takagiwa et al. ...... | 365/230.06 |
| 2006/0098520 A1 | * | 5/2006 | Asano et al. .......... | 365/230.06 |

* cited by examiner

*Primary Examiner*—Son L. Mai
(74) *Attorney, Agent, or Firm*—Steve Mendelsohn (57) ABSTRACT

In one embodiment of the invention, an address decoder for decoding a word-line address to energize a word line in a block of computer memory. Instead of relying on a distinct enable signal, a clock signal provides a reset function and an enable function to the address decoder. In one implementation, the address decoder includes negative-level-sense latches and 3-input AND gates to generate decoded address bits. Using the clock signal as one of the inputs to the AND gates ensures that all of the decoded address bits are 0 when the clock signal is low and that exactly one decoded address bit is 1 when the clock signal is high. In this way, the address decoder ensures that two or more word lines are not energized at the same time.

19 Claims, 6 Drawing Sheets

CLOCK RESET ADDRESS DECODER FOR BLOCK MEMORY

TECHNICAL FIELD

The present invention relates to computer memory, and, in particular, to address decoders for accessing rows of memory cells in block memory.

BACKGROUND

In a typical block of computer memory, memory cells are arranged in rows and columns, where the memory cells in each row are accessed by energizing a word line shared by those memory cells, where each different row has its own unique word line and each word line has its own unique address in the memory block.

For example, for a block of computer memory having 64 rows of memory cells, each of the 64 different word lines would typically have its own unique 6-bit address. A particular row of memory cells is accessed by applying the 6-bit address of the row's corresponding word line to an address decoder that is connected to all 64 word lines. The address decoder decodes (i.e., interprets) the 6-bit address and energizes the corresponding word line. In typical memory blocks, at most one word line is energized at a time.

Figure 1:
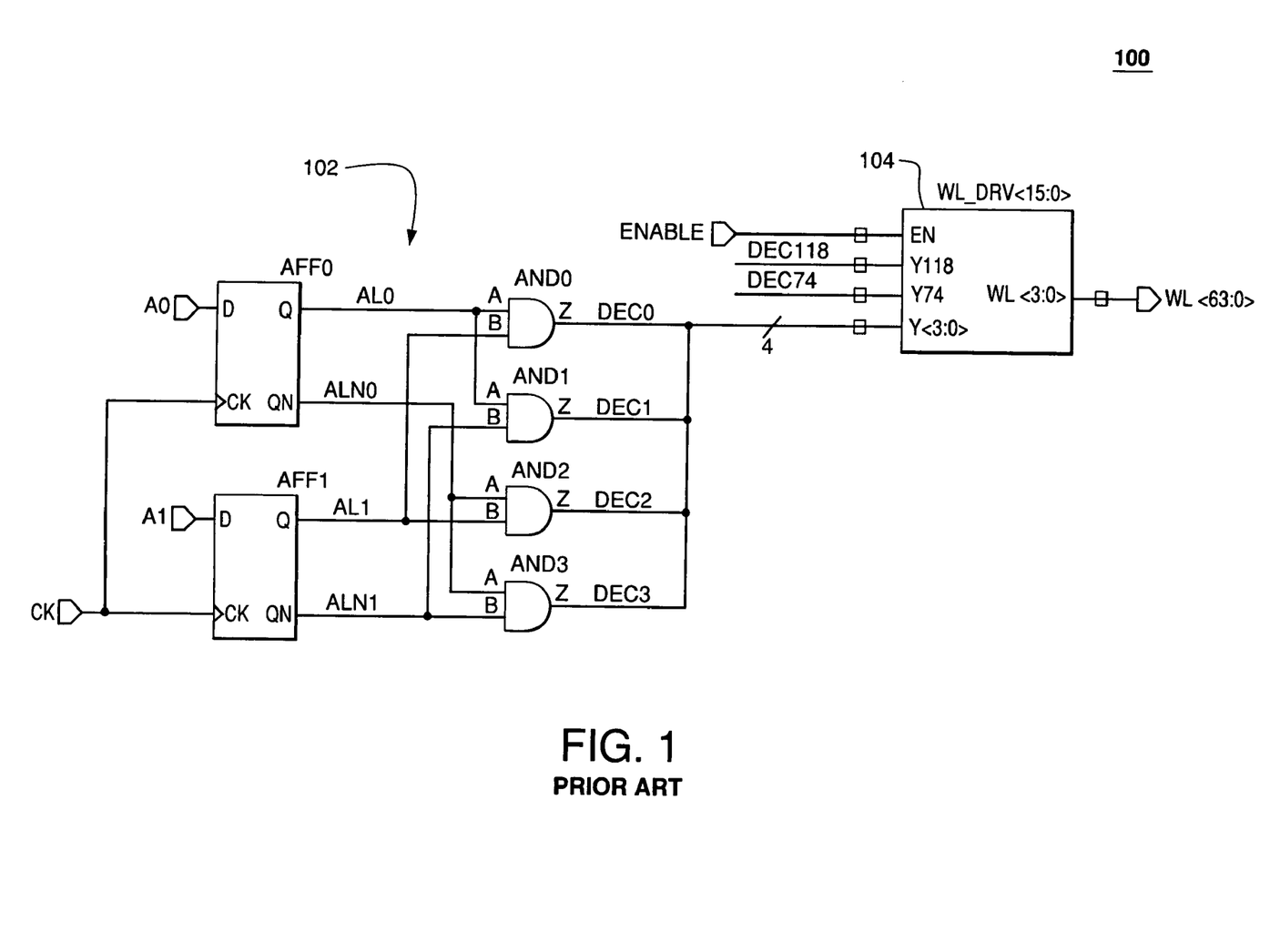
FIG. 1 shows a schematic block diagram of a portion of a conventional address decoder for decoding a 6-bit word-line address to energize one of 64 word lines in a block of computer memory.

FIG. 1 shows a schematic block diagram of a portion of a conventional address decoder 100 for decoding a 6-bit word-line address to energize one of 64 word lines in a block of computer memory. FIG. 1 shows 2-bit decoder 102 and word-line driver 104. Two-bit decoder 102 receives bit A0 and bit A1 as well as clock signal CK and generates four decoded bit values DEC0-DEC4, which are applied to the Y<3:0> input of word-line driver 104. Word-line driver 104 also receives two other decoded bit values DEC74 and DEC118 (at its Y118 and Y118 inputs, respectively) as well as enable signal ENABLE (at its EN input) and generates four word-line drive signals WL<3:0> that are applied to four of the 64 word lines in the memory block. In this example, A0 and A1 are two of the six bits (e.g., the two least significant bits (LSBs)) in the 6-bit word-line address (A5 A4 A3 A2 A1 A0) used to access one of the rows in the memory block.

The components of conventional address decoder 100 that are not shown in FIG. 1 include:
A 2-bit decoder, similar to 2-bit decoder 102, that converts word-line address bits A2 and A3 into four decoded bit values DEC4-DEC7;
A 2-bit decoder, similar to 2-bit decoder 102, that converts word-line address bits A4 and A5 into four decoded bit values DEC8-DEC11; and
Fifteen other word-line drivers similar to word-line driver 104, each connected to a different set of four word lines in the memory block.

In addition to receiving all four decoded bits DEC0-DEC3, each of the 16 different word-line drivers also receives a unique 2-bit combination of one of decoded bits DEC4-DEC7 and one of decoded bits DEC8-11, where each different 2-bit combination corresponds to a different set of four word lines in the memory block.

As shown in FIG. 1, 2-bit decoder 102 includes two edge-triggered flip-flops AFF0 and AFF1 and four logical-AND gates AND0-AND3. Flip-flop AFF0 receives address bit A0 at its data input D and clock CK at its clock input CK and presents, at each rising edge of clock CK, the current value of bit A0 at its output Q as signal AL0 and an inverted version of the current value of bit A0 at its output QN as signal ALN0. Similarly, flip-flop AFF1 receives address bit A1 at its data input D and clock CK at its clock input CK and presents, at each rising edge of clock CK, the current value of bit A1 at its output Q as signal AL1 and an inverted version of the current value of bit A1 at its output QN as signal ALN1.

Each AND gate ANDi generates a different decoded bit value DECi by applying the logical AND operation to its two inputs A and B. Table I illustrates the processing implemented by 2-bit decoder 102 for the four different possible combinations of values for bits A0 and A1. This table indicates that a different one (and only one) of DEC1-DEC4 is 1 for each different combination of A0 and A1.

TABLE I

| 2-BIT DECODER PROCESSING | | | | | | | | | |
|---|---|---|---|---|---|---|---|---|---|
| A1 | A0 | AL1 | ALN1 | AL0 | ALN0 | DEC0 | DEC1 | DEC2 | DEC3 |
| 0 | 0 | 0 | 1 | 0 | 1 | 0 | 0 | 0 | 1 |
| 0 | 1 | 0 | 1 | 1 | 0 | 0 | 1 | 0 | 0 |
| 1 | 0 | 1 | 0 | 0 | 1 | 0 | 0 | 1 | 0 |
| 1 | 1 | 1 | 0 | 1 | 0 | 1 | 0 | 0 | 0 |

Figure 2:
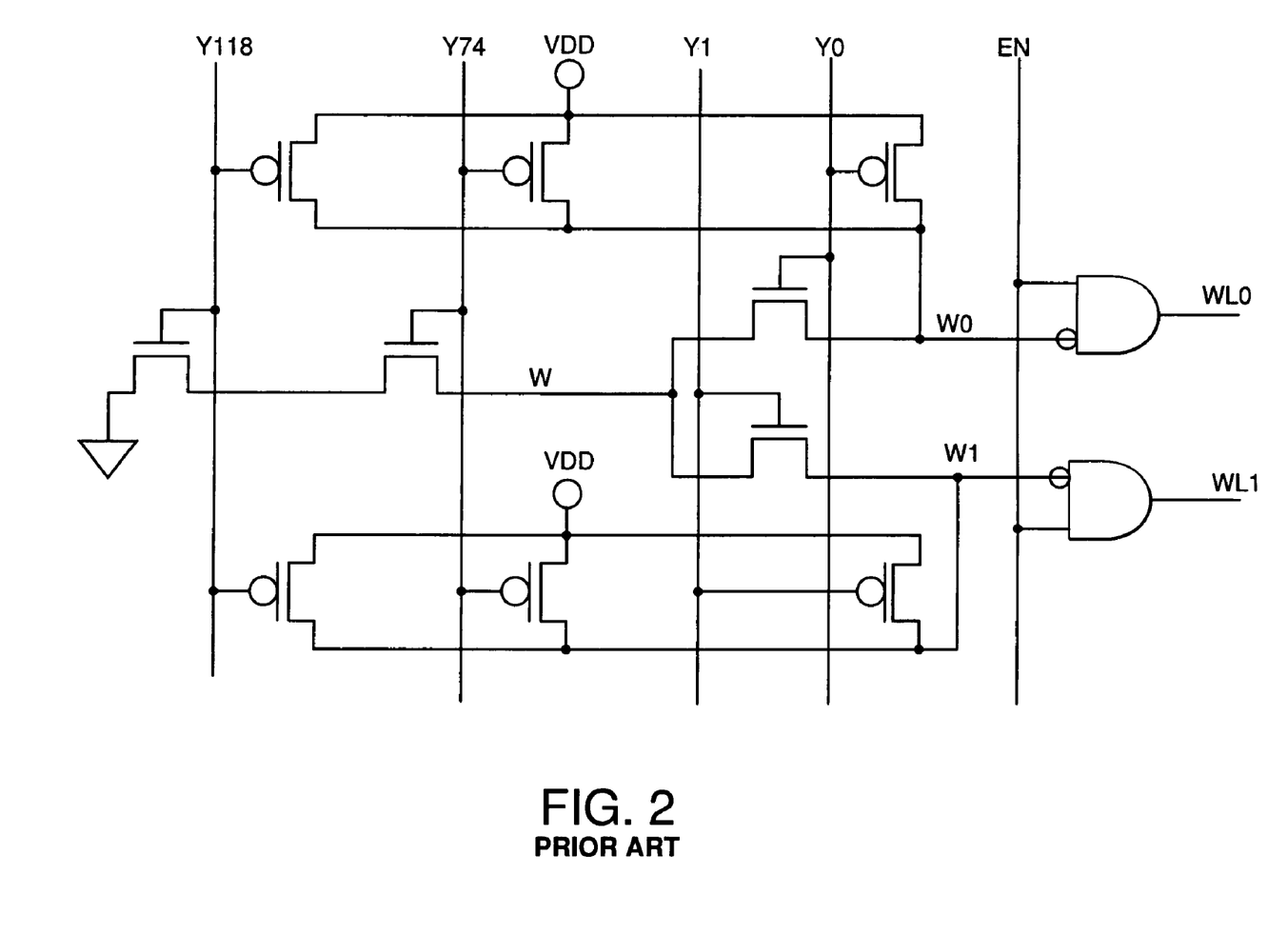
FIG. 2 shows a schematic diagram of a portion of a conventional word-line driver that may be used to implement each of the 16 word-line drivers in the address decoder of FIG. 1.

FIG. 2 shows a schematic diagram of a portion of a conventional word-line driver BA, which may be used to implement word-line driver 104 and each of the 15 other word-line drivers in address decoder 100 of FIG. 1. In particular, FIG. 2 shows that portion of word-line driver BA responsible for controlling two of the four word lines (labeled WL0 and WL1) controlled by word-line driver BA based on the values of decoded bits Y0, Y1, Y74, and Y118. Not shown in FIG. 2 is a similar portion responsible for controlling the remaining two word lines controlled by word-line driver BA based on the values of decoded bits Y2, Y3, Y74, and Y118.

Assuming that Y74 and Y118 are both high (i.e., logical value 1), then the circuitry of FIG. 2 will cause (1) word-line drive signal WL0 to be high (i.e., thereby energizing word line WL0), if both Y0 and EN are both high and (2) word-line drive signal WL1 to be high (i.e., thereby energizing word line WL1), if both Y1 and EN are both high. Note that the signals W0 and W1 are inverted at the inputs of the corresponding AND gates.

The purpose of the enable signal EN is to ensure that all of the processing to the left of the final AND gates in FIG. 2 (including the processing of the 2-bit decoders, such as decoder 102 of FIG. 1) has settled before any word-line drive signal is generated, in order to prevent two or more word lines from being driven at the same time.

Figure 3:
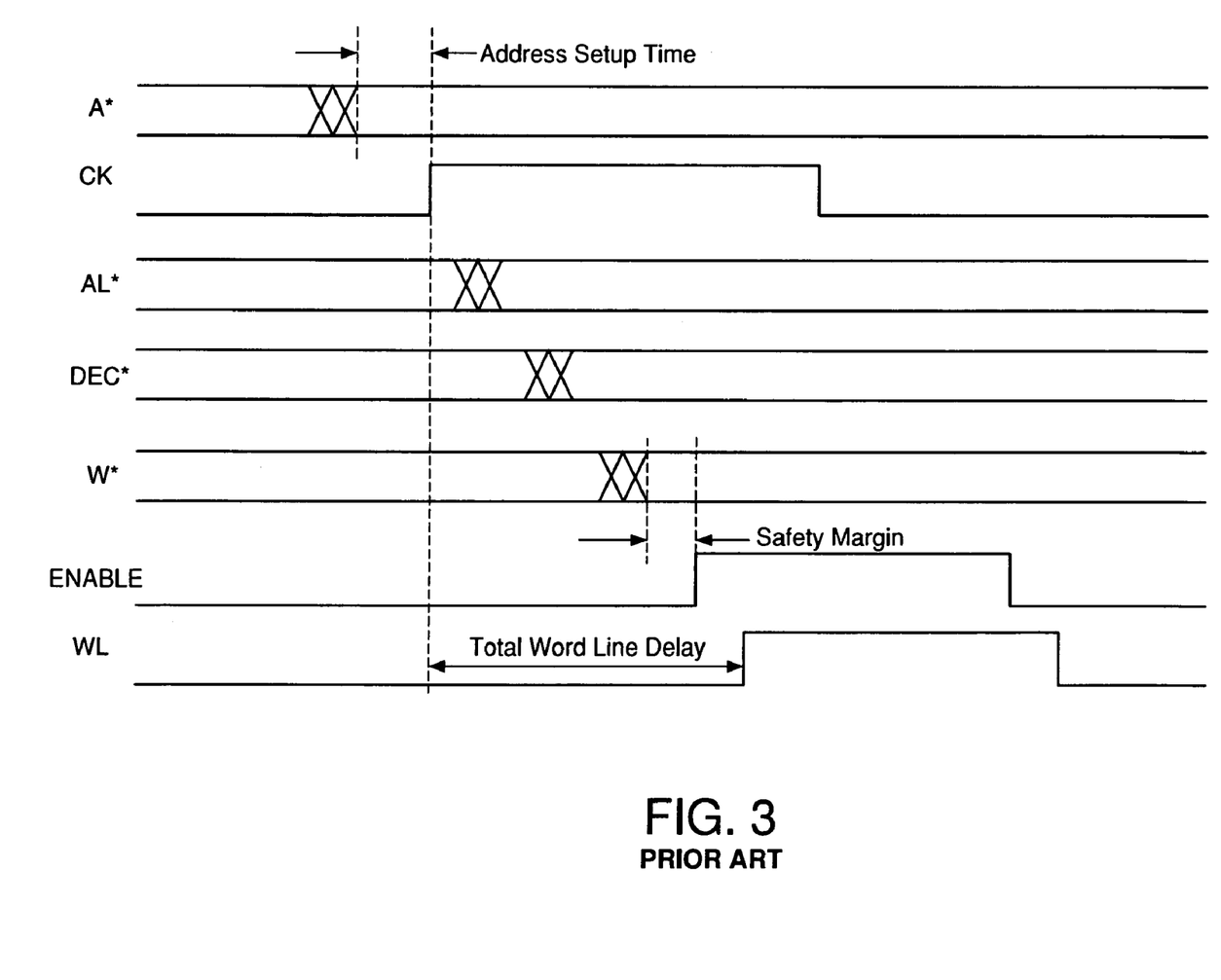
FIG. 3 shows a timing diagram illustrating the timing of the processing of the circuitry shown in FIGS. 1 and 2.

FIG. 3 shows a timing diagram illustrating the timing of the processing of the circuitry shown in FIGS. 1 and 2. Time line A* indicates the time that it takes to set up and apply the various word-line address bits Ai to the D inputs of the various flip-flops (e.g., A0 to input D of AFF0 in FIG. 1) prior to the rising edge of clock CK, illustrated in time line CK. Time line AL* indicates the time that it takes for the flip-flops to generate their output values ALi and ALNi. Time line DEC* indicates the time that it takes for the AND gates in FIG. 1 to generate their output values DECi. Time line W* indicates the time that it takes for the transistors shown in FIG. 2 to generate and apply the input values Wi to the AND gates in FIG. 2.

Time line ENABLE indicates that the enable signal is not asserted until all of the previous processing has settled, and time line WL indicates the total delay from the rising edge of clock CK until the corresponding word-line drive signal WLi goes high (including the time that it takes the AND gates in FIG. 2 to generate their outputs). Note that the ENABLE signal is delayed an additional amount to provide a safety margin to account for process, voltage, and temperature (PVT) variations.

The provision and use of the ENABLE signal increases the power consumption and layout area, while reducing the speed of the resulting address decoder circuitry.

SUMMARY

In one embodiment, the present invention is an integrated circuit having an address decoder for a memory block comprising a plurality of rows of memory cells and at least one word line for each row of memory cells. The address decoder is connected to receive a word-line address and a clock signal and adapted to decode the word-line address in order to energize a corresponding word line to access a corresponding row of memory cells in the memory block, wherein the clock signal provides a reset function and an enable function in the address decoder. The reset function ensures that all word lines in the memory block are simultaneously de-energized, and the enable function ensures that at most one word line in the memory block is energized at a time.

In another embodiment, the present invention is a method and apparatus for controlling word lines in a memory block comprising a plurality of rows of memory cells and at least one corresponding word line for each row of memory cells. A word-line address and a clock signal are received. The word-line address is decoded in order to energize a corresponding word line to access a corresponding row of memory cells, wherein the clock signal provides a reset function and an enable function during the decoding. The reset function ensures that all word lines in the memory block are simultaneously de-energized, and the enable function ensures that at most one word line in the memory block is energized at a time.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 4:
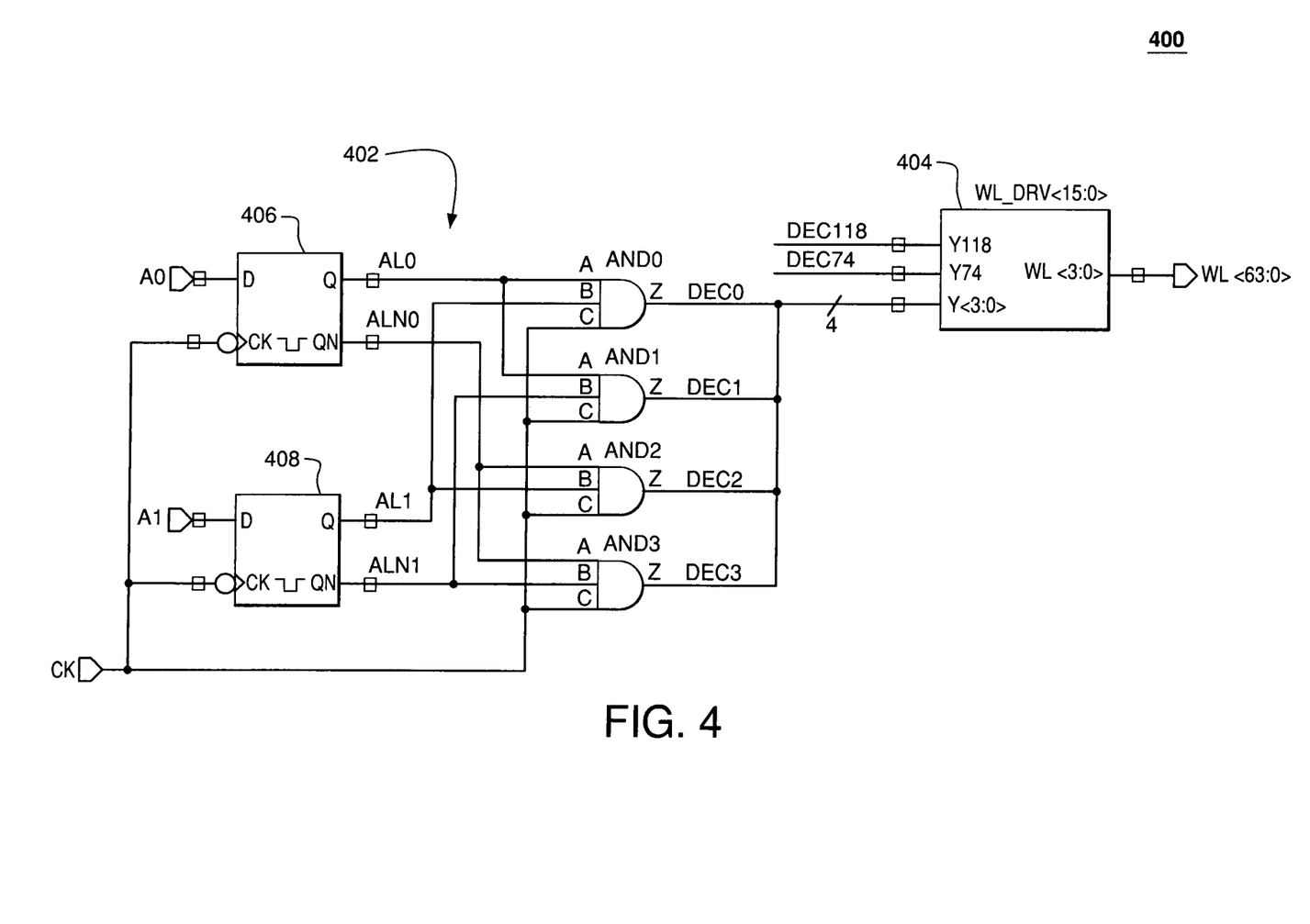
FIG. 4 shows a schematic block diagram of a portion of an address decoder for decoding a 6-bit word-line address to energize one of 64 word lines in a block of computer memory, according to one embodiment of the present invention.

FIG. 4 shows a schematic block diagram of a portion of an address decoder 400 for decoding a 6-bit word-line address to energize one of 64 word lines in a block of computer memory, according to one embodiment of the present invention. Similar to FIG. 1, FIG. 4 shows 2-bit decoder 402 and word-line driver 404. Like 2-bit decoder 102 of FIG. 1, 2-bit decoder 402 receives bit A0 and bit A1 as well as clock signal CK and generates four decoded bit values DEC0-DEC4, which are applied to the Y<3:0> input of word-line driver 404. Like word-line driver 104 of FIG. 1, word-line driver 404 also receives two other decoded bit values DEC74 and DEC118 (at the Y118 and Y118 inputs, respectively) and generates four word-line drive signals WL<3:0> that are applied to four of the 64 word lines in the memory block. Significantly, however, unlike word-line driver 104, word-line driver 404 does not require a distinct enable signal, such as the ENABLE signal of FIG. 1.

Similar to FIG. 1, the components of address decoder 400 that are not shown in FIG. 4 include:

A 2-bit decoder, similar to 2-bit decoder 402, that converts word-line address bits A2 and A3 into four decoded bit values DEC4-DEC7;

A 2-bit decoder, similar to 2-bit decoder 402, that converts word-line address bits A4 and A5 into four decoded bit values DEC8-DEC11; and Fifteen other word-line drivers similar to word-line driver 404, each connected to a different set of four word lines in the memory block.

In addition to receiving all four decoded bits DEC0-DEC3, each of the 16 different word-line drivers also receives a unique 2-bit combination of one of decoded bits DEC4-DEC7 and one of decoded bits DEC8-11, where each different 2-bit combination corresponds to a different set of four word lines in the memory block.

As shown in FIG. 4, 2-bit decoder 402 includes two negative-level-sense latches 406 and 408 and four 3-input logical-AND gates AND0-AND3. Latch 406 receives address bit A0 at its data input D and clock CK at its clock input CK and generates its output Q as signal AL0 and an inverted version of Q at its output QN as signal ALN0. Similarly, latch 408 receives address bit A1 at its data input D and clock CK at its clock input CK and generates its output Q as signal AL1 and an inverted version of Q at its output QN as signal ALN1. A negative-level-sense latch passes the value at its input D to its output Q and an inverted version of the value at its input D to its output QN, if clock CK is low. If clock CK is high, then outputs Q and QN are latched at their previous values (i.e., when clock CK was most recently low), such that changes in the value applied at input D do not affect the values at outputs Q and QN.

Each 3-input AND gate ANDi generates a different decoded bit value DECi by applying the logical AND operation to its three inputs A, B, and C, where C is clock CK for all four AND gates. Applying the clock signal CK as one of the three inputs to each AND gate ensures that the corresponding output signal will not be 1 until after the next rising edge of clock CK. Assuming that clock CK is high (i.e., logical 1), the processing implemented by 2-bit decoder 402 for the four different possible combinations of values for A0 and A1 will generate the same values for decoded bits DEC0-DEC3 as those shown in Table I for 2-bit decoder 102 of FIG. 1.

Figure 5:
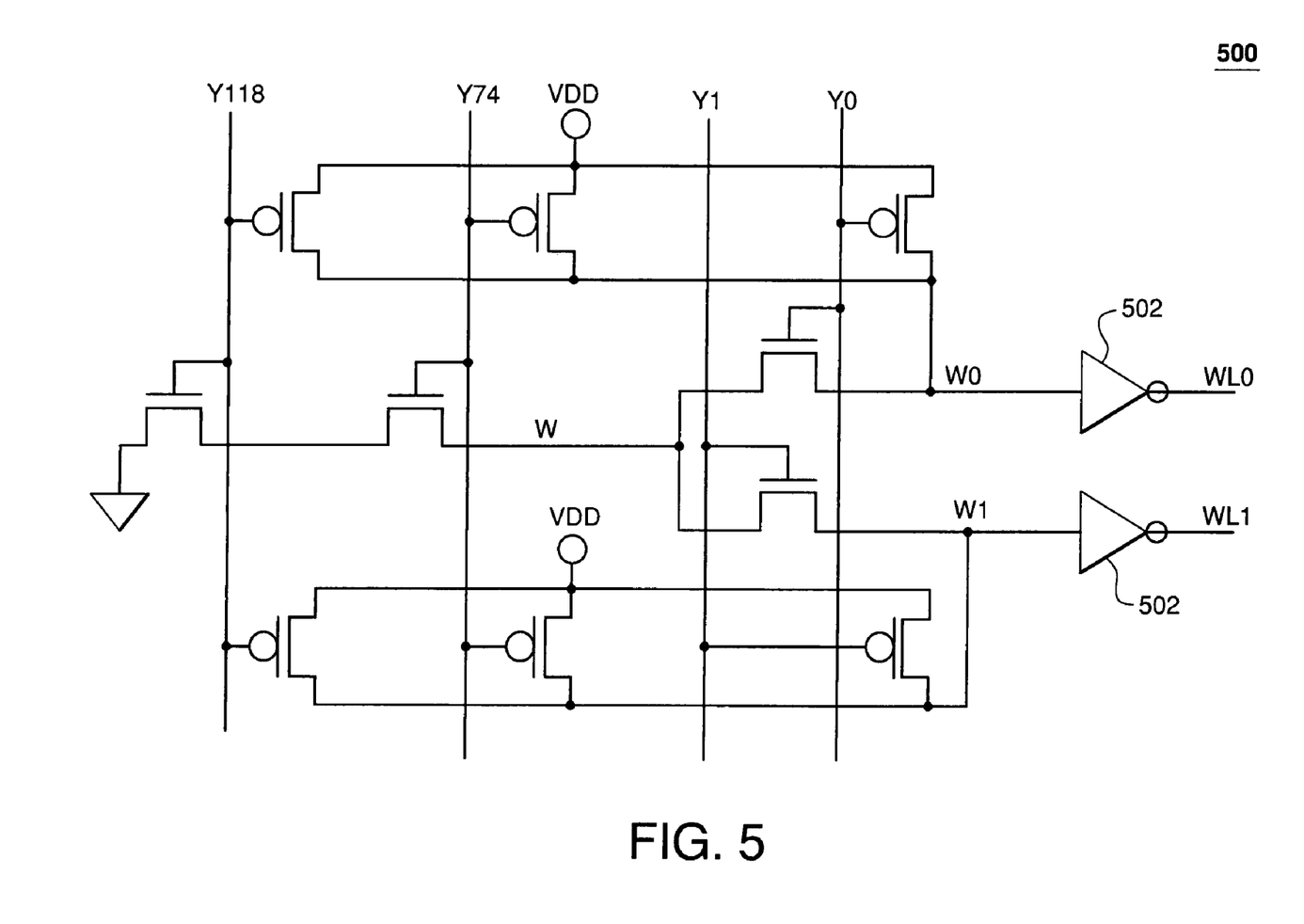
FIG. 5 shows a schematic diagram of a portion of a word-line driver that may be used to implement each of the 16 word-line drivers in the address decoder of FIG. 4.

FIG. 5 shows a schematic diagram of a portion of a word-line driver 500, which may be used to implement word-line driver 404 and each of the 15 other word-line drivers in address decoder 400 of FIG. 4. In particular, FIG. 5 shows that portion of word-line driver 500 responsible for controlling two of the four word lines (labeled WL0 and WL1) controlled by word-line driver 500 based on the values of decoded bits Y0, Y1, Y74, and Y118. Not shown in FIG. 4 is a similar portion responsible for controlling the remaining two word lines controlled by word-line driver 500 based on the values of decoded bits Y2, Y3, Y74, and Y118.

Assuming that Y74 and Y118 are both high (i.e., logical value 1), then the circuitry of FIG. 5 will cause (1) word-line drive signal WL0 to be high (i.e., thereby energizing word line WL0), if Y0 is high and (2) word-line drive signal WL1 to be high (i.e., thereby energizing word line WL1), if Y1 is high. The circuitry used to generate signals W0 and W1 in FIG. 5 is the same as the circuitry used to generate signals W0 and W1 in FIG. 2. Instead of the AND gates of FIG. 2, each signal Wi is inverted by corresponding inverter 502 to generate word-line drive signal WLi.

As such, like address decoder 100 of FIG. 1, address decoder 400 of FIG. 4 decodes a 6-bit word-line address and energizes the corresponding one of 64 different word lines. Unlike conventional address decoder 100, however, address decoder 400 of the present invention performs those functions without requiring the provision and use of an enable signal, such as the ENABLE signal in FIG. 1.

Figure 6:
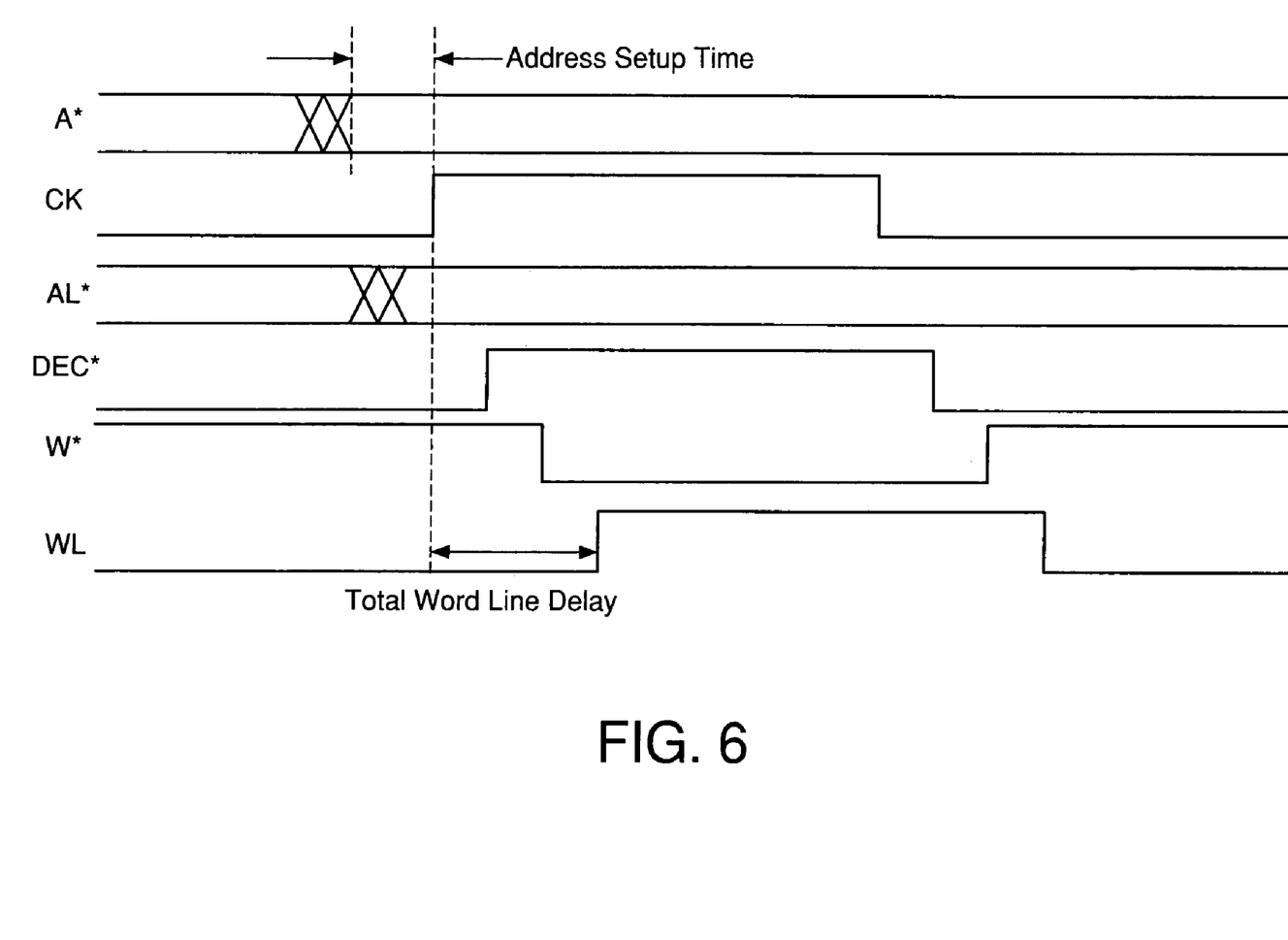
FIG. 6 shows a timing diagram illustrating the timing of the processing of the circuitry shown in FIGS. 4 and 5.

FIG. 6 shows a timing diagram illustrating the timing of the processing of the circuitry shown in FIGS. 4 and 5. Time line A* indicates the time that it takes to set up and apply the various word-line address bits Ai to the D inputs of the various latches (e.g., A0 to input D of latch 406) prior to the rising edge of clock CK, illustrated in time line CK. Time line AL* indicates the time that it takes for the latches to generate their output values ALi and ALNi. Note that, since the latches are negative-level-sense latches, they operate prior to the rising edge of clock CK to provide the A and B inputs to the various 3-input AND gates in FIG. 4. When the rising edge of clock CK occurs, the 3-input AND gates can begin to generate their output values DECi, as indicated in time line DEC*. Time line W* indicates the time that it takes for the transistors shown in FIG. 5 to generate the values Wi in FIG. 2. Note that only one of the four DECi signals will go high with the clock and only one Wi will go low.

Time line WL indicates the total delay from the rising edge of clock CK until the corresponding word-line drive signal WLi goes high (including the time that it takes for the Wi signals to pass through the corresponding inverters 502).

Although FIGS. 3 and 6 should be interpreted as being more qualitative than quantitative, nevertheless, the timing diagrams do indicate that the total word-line delay of address decoder 400 of the present invention is smaller than the total word-line delay of conventional address decoder 100 of FIG. 1. Moreover, in addition to enabling an increase in the speed of the resulting address decoder circuitry, the present invention enables a reduction in both power consumption and layout area by avoiding having to provide an enable signal similar to the ENABLE signal of FIG. 1 and the EN signal of FIG. 2.

Instead, address decoder 400 uses clock signal CK as both a reset signal and an enable signal that prevents two or more word lines from being energized at the same time. In particular, when clock signal CK goes low, the values of all four decoded bits DEC0-DEC3 in FIG. 4 will be driven to zero, ensuring that all word lines will be de-energized until the next rising edge in clock signal CK, which, in turn, will cause one (and only one) word line to be energized. In this way, clock signal CK initiates a reset function at each falling edge and an enable function at each rising edge.

Although the present invention has been described in the context of an address decoder for a memory block having 64 different rows of memory in which each pair of bits in the corresponding 6-bit word-line address are decoded by a separate two-bit decoder and each set of four word lines is controlled by a different word-line driver, the invention is not so limited. In general, the invention can be implemented in the context of other configuration memory blocks, including those having:

Other numbers of rows in the memory block and correspondingly other numbers of bits in the word-line address;
Bit decoders that decode other than two bits at a time; and
Word-line drivers that control other than sets of four word lines.

Furthermore, the specific circuitry shown in FIGS. 4 and 5 may be viewed as exemplary of different possible circuit configurations that achieve analogous results.

For example, instead of using negative-level-sense latches and 3-input AND gates in each 2-bit decoder, an address decoder could be implemented using positive-level-sense latches and suitable logic gates such that clock CK initiates a reset function at each rising edge and an enable function at each falling edge.

As another example, instead of generating decoded bit values DEC0-DEC3 that are either (i) reset to all 0s or (ii) enabled to three 0s and one 1, address decoder circuitry could be implemented such that the decoded bit values are either (i) reset to all 1s or (ii) enabled to three 1s and one 0.

The present invention can be implemented for any circuitry having blocks of memory, including dedicated memory devices as well as circuits having embedded memory, e.g., application-specific integrated circuits (ASICs) and programmable devices such as field-programmable gate arrays (FPGAs), programmable logic devices (PLDs), mask-programmable gate arrays (MPGAs), simple programmable logic device (SPLDs), and complex programmable logic devices (CPLDs).

The memory blocks may comprise any suitable type of memory cell, including, but not limited to, static random access memory (SRAM) cells, dynamic RAM (DRAM) cells, virtual DRAM cells, and single transistor cells. Moreover, the memory cells could have any number of ports, such as single-port memory cells, dual-port memory cells, register files, FIFOs, or multi-port memories.

It will be further understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

I claim:

1. An integrated circuit having an address decoder for a memory block comprising a plurality of rows of memory cells and at least one word line for each row of memory cells, wherein:
the address decoder is connected to receive a word-line address and a clock signal and adapted to decode the word-line address in order to energize a corresponding word line to access a corresponding row of memory cells in the memory block;
the clock signal provides a reset function and an enable function in the address decoder;
the reset function ensures that all word lines in the memory block are simultaneously de-energized; and
the enable function ensures that at most one word line in the memory block is energized at a time.

2. The integrated circuit of claim 1, wherein the address decoder operates independent of an enable signal distinct from the clock signal.

3. The integrated circuit of claim 1, wherein the address decoder comprises:
one or more bit decoders, each bit decoder connected to receive the clock signal and a set of one or more address bits in the word-line address and adapted to decode the set of one or more address bits to generate a set of corresponding decoded bits; and
one or more word-line drivers, each word-line driver connected to receive a corresponding set of decoded bits and adapted to control a set of word lines.

4. The integrated circuit of claim 3, wherein each word-line driver operates independent of an enable signal distinct from the clock signal.

5. The integrated circuit of claim 3, wherein at least one bit decoder comprises:
one or more level-sense latches, each level-sense latch connected to receive a corresponding address bit at its data input and the clock signal at its clock input and adapted to generate its data output and its inverted data output based on the level of the clock signal; and
a set of logic gates connected to receive the data outputs and the inverted data outputs from the one or more level-sense latches and the clock signal and adapted to generate the set of corresponding decoded bits, such that:
if the clock signal is at a first level, then all of the decoded bits in the set have a first value; and
if the clock signal is at a second level, then exactly one of the decoded bits in the set has a second value different from the first value.

6. The integrated circuit of claim 5, wherein:
each level-sense latch is a negative-level-sense latch;
the set of logic gates comprises logical-AND gates;
the first level of the clock signal is low and the first decoded-bit value is 0; and
the second level of the clock signal is high and the second decoded-bit value is 1.

7. The integrated circuit of claim 6, wherein each bit decoder is a 2-bit decoder comprising two negative-level-sense latches and four 3-input logical-AND gates.

8. A method for controlling word lines in a memory block comprising a plurality of rows of memory cells and at least one corresponding word line for each row of memory cells, the method comprising:
receiving a word-line address and a clock signal; and
decoding the word-line address in order to energize a corresponding word line to access a corresponding row of memory cells, wherein:
the clock signal provides a reset function and an enable function during the decoding;
the reset function ensures that all word lines in the memory block are simultaneously de-energized; and
the enable function ensures that at most one word line in the memory block is energized at a time.

9. The method of claim 8, wherein the method operates independent of an enable signal distinct from the clock signal.

10. The method of claim 8, wherein decoding the word-line address comprises:
receiving the clock signal and a set of one or more address bits in the word-line address and decoding the set of one or more address bits to generate a set of corresponding decoded bits; and
receiving a corresponding set of decoded bits and controlling a set of word lines.

11. The method of claim 10, wherein the set of word lines are controlled independent of an enable signal distinct from the clock signal.

12. The method of claim 10, wherein decoding the set of one or more address bits comprises:
receiving a corresponding address bit and the clock signal and generating a data output and an inverted data output based on the level of the clock signal; and
receiving one or more data outputs and one or more inverted data outputs and the clock signal and generating the set of corresponding decoded bits, such that:
if the clock signal is at a first level, then all of the decoded bits in the set have a first value; and
if the clock signal is at a second level, then exactly one of the decoded bits in the set has a second value different from the first value.

13. The method of claim 12, wherein:
the first level of the clock signal is low and the first decoded-bit value is 0; and
the second level of the clock signal is high and the second decoded-bit value is 1.

14. Apparatus for controlling word lines in a memory block comprising a plurality of rows of memory cells and at least one corresponding word line for each row of memory cells, the apparatus comprising:
means for receiving a word-line address and a clock signal; and
means for decoding the word-line address in order to energize a corresponding word line to access a corresponding row of memory cells, wherein:
the clock signal provides a reset function and an enable function for the decoding means;

the reset function ensures that all word lines in the memory block are simultaneously de-energized; and the enable function ensures that at most one word line in the memory block is energized at a time.

15. The apparatus of claim 14, wherein the apparatus operates independent of an enable signal distinct from the clock signal.

16. The apparatus of claim 14, wherein the means for decoding comprises:

means for receiving the clock signal and a set of one or more address bits in the word-line address and decoding the set of one or more address bits to generate a set of corresponding decoded bits; and means for receiving a corresponding set of decoded bits and controlling a set of word lines.

17. The apparatus of claim 16, wherein the set of word lines are controlled independent of an enable signal distinct from the clock signal.

18. The apparatus of claim 16, wherein the means for decoding the set of one or more address bits comprises:

means for receiving a corresponding address bit and the clock signal and generating a data output and an inverted data output based on the level of the clock signal; and means for receiving one or more data outputs and one or more inverted data outputs and the clock signal and generating the set of corresponding decoded bits, such that:

if the clock signal is at a first level, then all of the decoded bits in the set have a first value; and if the clock signal is at a second level, then exactly one of the decoded bits in the set has a second value different from the first value.

19. The apparatus of claim 18, wherein:

the first level of the clock signal is low and the first decoded-bit value is 0; and the second level of the clock signal is high and the second decoded-bit value is 1.

* * * * *